(12) United States Patent
Sakamoto

(10) Patent No.: US 9,048,252 B2
(45) Date of Patent: Jun. 2, 2015

(54) SEMICONDUCTOR DEVICE AND METHOD FOR MANUFACTURING SEMICONDUCTOR DEVICE

(75) Inventor: Toshiro Sakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/003,067

(22) PCT Filed: Mar. 9, 2012

(86) PCT No.: PCT/JP2012/001644
§ 371 (c)(1),
(2), (4) Date: Sep. 4, 2013

(87) PCT Pub. No.: WO2012/120899
PCT Pub. Date: Sep. 13, 2012

(65) Prior Publication Data
US 2013/0341716 A1  Dec. 26, 2013

(30) Foreign Application Priority Data

Mar. 9, 2011 (JP) ................................. 2011-052052

(51) Int. Cl.
*H01L 29/66* (2006.01)
*H01L 21/8234* (2006.01)
*H01L 29/08* (2006.01)
(Continued)

(52) U.S. Cl.
CPC ..... *H01L 29/66492* (2013.01); *H01L 21/26586* (2013.01); *H01L 21/823412* (2013.01); *H01L 21/823418* (2013.01); *H01L 21/823456* (2013.01); *H01L 29/0847* (2013.01);
(Continued)

(58) Field of Classification Search
None
See application file for complete search history.

(56) References Cited

U.S. PATENT DOCUMENTS 5,801,416 A  9/1998 Choi et al.
5,834,347 A  11/1998 Fukatsu et al.
(Continued)

FOREIGN PATENT DOCUMENTS

JP  62-293774 A  12/1987
JP  07-122740 A  5/1995
(Continued)

OTHER PUBLICATIONS

Machine translation of Toshima (JP 2009-245998).*
(Continued)

*Primary Examiner* — Yasser A Abdelaziez
(74) *Attorney, Agent, or Firm* — Morgan, Lewis & Bockius LLP

(57) ABSTRACT

There are provided a semiconductor device having a drain region making a BLDD structure withstandable against a high voltage, sufficiently suppressing a hot-carrier deterioration, and having a high ESD withstandable characteristic, and a method for manufacturing the same. A semiconductor device is formed including a MOS transistor having a source region and a drain region both formed in a semiconductor substrate, and a channel region formed therebetween. At this time, the concentration of holes emitted form P-type impurities injected into the channel region and contributing an electrical conduction is lower at a side close to the drain region than at a side close to the source region. The drain region includes a drift region into which N-type impurities are injected. The drift region extends toward the channel region from the drain region except a nearby area to the surface of the semiconductor substrate.

8 Claims, 8 Drawing Sheets

(51) Int. Cl.
  *H01L 29/10* (2006.01)
  *H01L 29/78* (2006.01)
  *H01L 21/265* (2006.01)

(52) U.S. Cl.
  CPC ...... *H01L29/1045* (2013.01); *H01L 29/66659* (2013.01); *H01L 29/7835* (2013.01)

(56) References Cited

U.S. PATENT DOCUMENTS

| | | |
|---|---|---|
| 5,877,531 A | 3/1999 | Fukatsu et al. |
| 5,956,588 A | 9/1999 | Choi et al. |
| 2002/0048912 A1* | 4/2002 | Kikuchi et al. ............... 438/514 |
| 2002/0125531 A1 | 9/2002 | Kikuchi et al. |
| 2006/0102928 A1 | 5/2006 | Nakamura |
| 2007/0164328 A1 | 7/2007 | Nakamura |
| 2008/0237703 A1 | 10/2008 | Lin et al. |
| 2010/0240177 A1 | 9/2010 | Shima |
| 2011/0108917 A1 | 5/2011 | Shima |

FOREIGN PATENT DOCUMENTS

| | | |
|---|---|---|
| JP | 07-240515 A | 9/1995 |
| JP | 08-18052 A | 1/1996 |
| JP | 08-264788 A | 10/1996 |
| JP | 2000-164854 A | 6/2000 |
| JP | 2002-261276 A | 9/2002 |
| JP | 2005-223145 A | 8/2005 |
| JP | 2006-140318 A | 6/2006 |
| JP | 2009245998 * | 3/2008 |
| JP | 2009-245998 A | 10/2009 |
| JP | 2010-225636 A | 10/2010 |
| JP | 2011-100911 A | 5/2011 |
| TW | 485632 | 5/2002 |
| TW | 200703627 | 1/2007 |
| TW | 200840047 A | 10/2008 |

OTHER PUBLICATIONS

Japanese Office Action dated Apr. 8, 2014 in corresponding Japanese patent application.
International Search Report dated Jun. 12, 2012 for International Application No. PCT/JP2012/001644.
International Preliminary Report on Patentability dated Sep. 19, 2013, for the corresponding international application No. PCT/JP2012/001644.

* cited by examiner

SEMICONDUCTOR DEVICE AND METHOD FOR MANUFACTURING SEMICONDUCTOR DEVICE

TECHNICAL FIELD

The present invention relates to a semiconductor device and a method for manufacturing the semiconductor device focusing on a suppression of a hot-carrier deterioration and a protection from an ESD.

BACKGROUND ART

The input/output terminals of a semiconductor integrated circuit need a protection element (hereinafter, referred to as an ESD (Electrostatic Discharge) protection element) that protects an internal circuit from an ESD applied from a terminal electrode (hereinafter, referred to as a PAD).

FIG. 5 illustrates an example conventional ESD protection element of a semiconductor integrated circuit. The structure illustrated in FIG. 5 causes a source 1, a bulk 2, and a drain 3 of a MOS transistor to actuate as a bipolar transistor, thereby utilizing the MOS transistor for an internal circuit as an ESD protection element. The portion indicated by a reference numeral 4 in the figure is the gate of the MOS transistor.

When the MOS transistor utilized as a circuit element is used as the ESD protection element, it becomes unnecessary to form an element exclusive for an ESD protection, and thus the manufacturing process of the semiconductor integrated circuit can be shortened.

Moreover, in a case in which the drain is directly coupled with a PAD as the MOS transistor at an output stage, when the MOS transistor itself has an ESD withstandable characteristic, such a MOS transistor serves as a protection element, and thus it becomes unnecessary to additionally dispose an ESD protection element. Accordingly, the use of the MOS transistor also as the ESD protection element is desirable from the standpoint of the use efficiency of a chip area. In particular, it becomes a remarkable advantage in the case of a high-voltage MOS transistor that is often utilized as a MOS transistor at an output stage.

Conversely, microfabrication and higher withstand voltage are required for MOS transistors from the standpoint of a circuit operation. The ESD withstandable characteristic of recent MOS transistor subjected to microfabrication and made so as to be withstandable against a high voltage remarkably decreases, and such a MOS transistor is unable to serve as an ESD protection element. This tendency is quite apparent in the case of, in particular, high-voltage MOS transistors with a large heat generation amount. Accordingly, in the case of semiconductor integrated circuits that need a drain breakdown voltage that is equal to or higher than 15 V, it becomes a mainstream to additionally form an element exclusive for an ESD protection.

One of the reasons why it is difficult to cause a MOS transistor with a high drain breakdown voltage to serve as both circuit element and ESD protection element is a hot-carrier deterioration of an NMOS transistor. In the case of an NMOS transistor with a high withstand voltage, in order to ensure a drain breakdown voltage and a lifetime of hot-carriers, it is necessary to provide a drift region 6 of a low concentration in a drain region 3 so as to ease a drain electric field. FIG. 6 is a diagram illustrating a relationship between the drift region 6 and the drain region 3. The portion indicated by a reference numeral 5 in the figure is a high-concentration region which has higher concentration than that at the drift region 6.

In the low-concentration drift region 6, when the MOS transistor turns into a bipolar operation, a Kirk effect (base push-out effect) is likely to occur, and when an ESD occurs, a thermal destruction due to the concentration of electric fields is likely to occur at a boundary portion with the high-concentration region 5. In order to suppress the Kirk effect, it is necessary to form the impurity concentration of the whole drift region 6 as high as possible, and at the same time, as illustrated in FIG. 7, to form a middle-concentration region 7 with a middle impurity concentration between the impurity concentration of the drift region 6 and the impurity concentration of the high-concentration region 5 in the drain region 3, so as to make the concentration gradient in the drain region 3 to be gentle.

However, making the concentration of the drift region 6 to be higher results in the reduction of a hot-carrier lifetime, and the hot-carrier lifetime and the ESD withstandable characteristic are in a trade-off relationship. This trade-off relationship becomes remarkable when a gate insulating film is thin. Even in the case of a MOS transistor which requires a high drain breakdown voltage, it sometimes does not require such a high voltage for a gate electrode. In this case, it is required to form a gate insulating film thin to reduce the on resistance of the MOS transistor (e.g., $SiO_2$: 12 nm or so). When the gate insulating film is formed thin, it is necessary to dope impurities for a threshold control in a channel region at a relatively high concentration so as to control the threshold of the MOS transistor.

When, however, the impurity concentration of the channel region is set to be high, since the channel region and the drain region have opposite impurity conductivities, as illustrated in FIG. 8, the concentration gradient of the impurities becomes extremely large at a boundary portion (PN junction) where a channel region 8 having a high impurity concentration and the drain region 6 adjoin with each other. When the impurity concentration gradient becomes sharp, the acceleration of electrons is promoted, the occurrence of impact ions becomes noticeable, and thus a hot-carrier deterioration becomes remarkable. Hence, in the case of NMOS transistors with a high withstand voltage of a drain, when, in particular, a gate insulating film is thin, it becomes further difficult to accomplish both ESD withstandable characteristic and hot-carrier lifetime.

As explained above, in order to allow an NMOS transistor with a drain breakdown voltage that is equal to or higher than 15 V to serve as both circuit element and ESD protection element, it is necessary to form a drain structure that suppresses a characteristic deterioration by hot-carriers at minimum to form a drift region with a concentration as high as possible.

Patent Document 1 discloses, as a technology of reducing a hot-carrier deterioration, a MOS transistor with a BLDD structure (a structure having a further low-concentration diffusion layer under a diffusion layer). According to the technology disclosed in Patent Document 1, when the MOS transistor operates, a drain current is caused to flow in a bypassed manner from a substrate surface to move the location where hot-carriers are produced apart from the substrate surface, thereby to prevent the produced hot-carriers from charging in a gate insulating film and a side wall.

Moreover, another technology of reducing a hot-carrier deterioration is to set the impurity concentration of a channel region below a gate electrode to be lower at a drain side than a source side. This eases an electric field in a PN junction forming a drain region, thereby suppressing an impact ionization. This technology is disclosed in, for example, Patent Document 2.

PRIOR ART DOCUMENTS

Patent Documents

Patent Document 1: JP S62-293774 A
Patent Document 2: JP 2009-245998 A

SUMMARY OF THE INVENTION

Problem to be Solved

However, the BLDD structure is applicable to transistors with a drain breakdown voltage that is around 10 V, and thus it cannot be directly applied to MOS transistors with a drain breakdown voltage that is equal to or higher than 15 V.

Moreover, when the BLDD structure is simply made to be withstandable against a high voltage, if the concentration of a drift region is made high so as to obtain a sufficient ESD withstandable characteristic in the case of a high-voltage MOS transistors having a thin gate insulating film ($SiO_2$: 12 nm or so), it does not become a sufficient countermeasure against a hot-carrier deterioration.

As explained above, the conventional BLDD structure cannot accomplish both sufficient ESD withstandable characteristic and hot-carrier lifetime in the case of high-voltage MOS transistors with a thin gate insulating film ($SiO_2$: 12 nm or so) that have the most strict trade-off relationship between the ESD withstandable characteristic and the hot-carrier lifetime.

Moreover, the technology disclosed in Patent Document 2 is capable of suppressing a hot-carrier deterioration to some level, but the manufacturing method disclosed therein does not bring about an effect of bypassing a current flow like the BLDD structure. Hence, this structure is also unable to accomplish both sufficient ESD withstandable characteristic and hot-carrier lifetime.

The present invention has been made in view of the aforementioned circumstances, and it is an object of the present invention to provide a semiconductor device and a method for manufacturing the same which have an effect of bypassing a current like a BLDD structure while ensuring a drain breakdown voltage is equal to or higher than 15 V, and which can ease an electric field at a PN junction forming a drain. According to the application of this technology, it becomes possible to accomplish a high ESD withstandable characteristic while sufficiently suppressing a hot-carrier deterioration.

Solution to the Problem

In order to address the above disadvantages, there is provided a semiconductor device according to an aspect of the present invention that includes a MOS transistor, the MOS transistor including: a source region (e.g., a source region S illustrated in FIG. 1) and a drain region (e.g., a drain region D illustrated in FIG. 1) both formed in a semiconductor substrate (e.g., a semiconductor substrate 1 illustrated in FIG. 1); and a channel region (e.g., a channel region C illustrated in FIG. 1) formed between the source region and the drain region, in which a concentration of a charged particle which is emitted from a first impurity with a first polarity injected in the channel region and which contributes to an electrical conduction in the channel region (e.g., a hole emitted from a P-type impurity) is lower at a side close to the drain region than at a side close to the source region, the drain region includes a drift region (e.g., a drift region 105 illustrated in FIG. 1) into which a second impurity with a second polarity (e.g., an N-type impurity) is injected, and the drift region extends toward the channel region from the drain region except a nearby area to a surface of the semiconductor substrate.

In the above aspect, the semiconductor device may further include: another MOS transistor having a lower drain breakdown voltage than the MOS transistor (e.g., a low-voltage MOS transistor illustrated in FIG. 3-3); a high-concentration region (e.g., a high-concentration region illustrated in FIG. 3-3A) entirely surrounded by the drift region and having a higher concentration of the second polarity than the drift region; and a middle-concentration region (e.g., a middle-concentration region 104 illustrated in FIG. 3-3A) having an impurity concentration of the second polarity higher than the drift region and lower than the high-concentration region, in which the middle-concentration region may at least partially surround the high-concentration region.

In the above aspect of the semiconductor device, the middle-concentration region may be formed simultaneously with a middle-concentration region of a source/drain region of another MOS transistor, and the high-concentration region maybe formed simultaneously with a high-concentration region of another source/drain region of the another MOS transistor.

According to another aspect of the present invention, there is provided a method for manufacturing a semiconductor device comprising a MOS transistor that includes a source region and a drain region both in a semiconductor substrate, the method including steps of: injecting a first impurity with a first polarity into the semiconductor substrate to form a first impurity diffusion region with the first polarity in a surface of the semiconductor substrate; forming a gate electrode on the first impurity diffusion region; injecting a second impurity with a second polarity through the drain region and a part of a top face of the gate electrode adjoining to the drain region; forming a second impurity diffusion region having a lower concentration of a charged particle emitted from the first impurity and contributing to an electrical conduction than the first impurity diffusion region below the gate electrode and at an end thereof at the drain-region side; and forming, below the second impurity diffusion region, a drift region with the second polarity that extends toward a channel region.

The semiconductor device manufacturing method of the above aspect may further include steps of: injecting the second impurity into the drift region to form a middle-concentration region having a higher impurity concentration than the first impurity diffusion region; and injecting the second impurity into the middle-concentration region to form a high-concentration region having a higher impurity concentration than the middle-concentration region.

According to the above aspect of the semiconductor device manufacturing method, in the formation of the middle-concentration region, a middle-concentration region of a source/drain region of another MOS transistor with a lower drain breakdown voltage than the MOS transistor may be simultaneously formed, and in the formation of the high-concentration region, a high-concentration region of another source/drain region of the another MOS transistor may be simultaneously formed.

Advantageous Effects of the Invention

According to the present invention, the polarity concentration of the channel region is lower at the drain-region side than at the source-region side. Hence, an occurrence of a hot-carrier at an end of the drain can be suppressed. Moreover, the drift region extends toward the channel region from the drain region except a nearby area to the surface of the semiconductor substrate. Hence, a current flows through a path bypassing the substrate surface near the drain region, and thus the location where a hot-carrier is produced becomes distant from the substrate surface. Accordingly, the produced hot-carrier is prevented from entering in the gate insulating film and the side wall.

The suppression of a hot-carrier deterioration enables the drift region to have a high concentration. Hence, according to the present invention, in a high-voltage MOS transistor having a drain breakdown voltage of equal to or higher than 15 V, a semiconductor device and a manufacturing method thereof which satisfy an ESD withstandable characteristic and a hot-carrier lifetime can be provided.

Moreover, according to the present invention, the middle-concentration region is provided which is entirely surrounded by the drift region, and which has an impurity concentration higher than the drift region and lower than the high-concentration region. Hence, the Kirk effect when an ESD occurs can be further effectively suppressed.

According to the semiconductor manufacturing method of the present invention, in the step of forming the low-concentration region, the impurity with the first polarity is injected below the end of the gate electrode to lower the concentration of the second polarity. Accordingly, a portion having a lower concentration of the second polarity can be formed in the channel region without an additional masking process.

Moreover, according to the semiconductor manufacturing method of the present invention, when the semiconductor device of the present invention is formed on the same substrate together with another MOS transistor of an LDD type, the middle-concentration region and the high-concentration region can be formed through the same ion implantations for a source/drain of a low concentration in the LDD structure and a source/drain region of a high concentration therein.

According to the present invention, the increase of the simulated number of processes can be suppressed, and the semiconductor device of the present invention can be manufactured more easily.

DESCRIPTION OF EMBODIMENTS

An explanation will be given of a semiconductor device and a method for manufacturing the same according to an embodiment of the present invention. This embodiment is carried out while focusing on a fact that in order to ensure a sufficient ESD withstandable characteristic in a high-voltage MOS transistor with a thin gate insulating film, it is appropriate to form a drain structure that suppresses a hot-carrier deterioration more than a BLDD structure, and to form a drift region at a concentration as high as possible so as to suppress a Kirk effect.

[Semiconductor Device]

Figure 1:
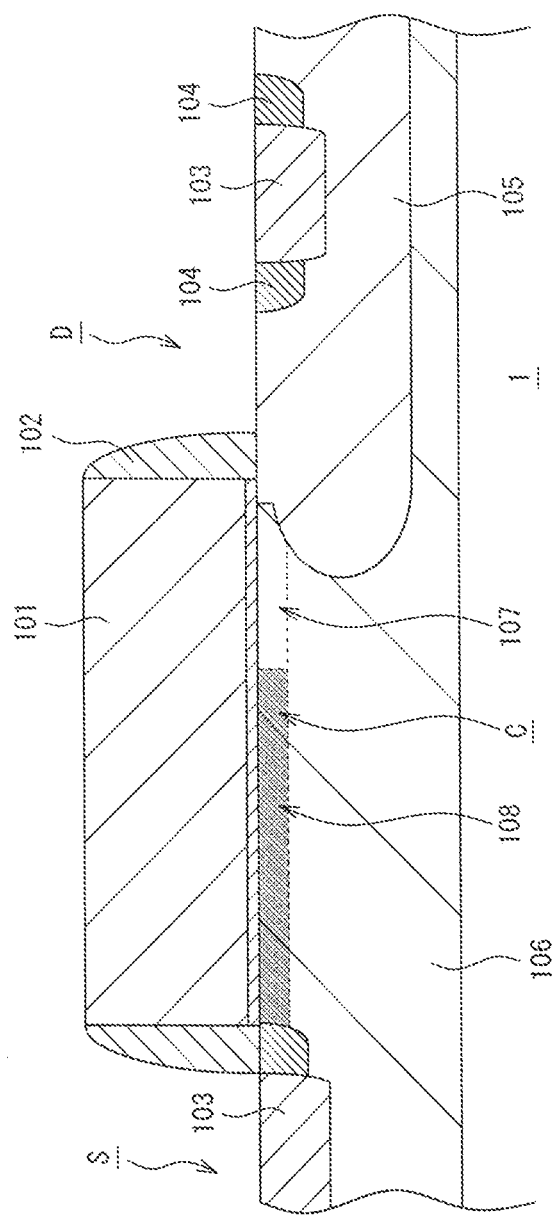
FIG. 1 is a cross-sectional view for explaining a semiconductor device according to an embodiment of the present invention.

FIG. 1 is a cross-sectional view for explaining a semiconductor device according to this embodiment. The illustrated semiconductor device (hereinafter, referred to as a high-voltage MOS transistor) is obtainable by applying the semiconductor device structure of this embodiment to a high-voltage MOS transistor with a thin gate insulating film ($SiO_2$: 12 nm or so).

According to the structure illustrated in FIG. 1, a P-well 106 is formed in a semiconductor substrate 1, and thus the high-voltage MOS transistor is an N-channel MOS transistor. A gate electrode 101 is formed on a channel region C via a gate insulating film. Spacers 102 are formed at both sides of the gate electrode 101, and a source-region-S side of the high-voltage MOS transistor employs an LDD (Lightly Doped Drain) structure.

The high-voltage MOS transistor of this embodiment is a MOS transistor including the source region S and a drain region D formed in the semiconductor substrate 1, and the channel region C formed between the source region and the drain region. The drain region D includes a drift region 105 doped with N-type impurities, and a high-concentration region 103 entirely surrounded by the drift region 105 and has a higher N-type impurity concentration than that of the drift region 105.

The drift region 105 extends toward the channel region C from the drain region D except the nearby area to the surface of the semiconductor substrate 1. The nearby area to the surface of the semiconductor substrate 1 is a range with a depth of substantially 0.1 μm from the outermost surface of the substrate.

Moreover, the concentration of the holes (hereinafter, in this specification, also referred to as a "P-type concentration") emitted from the P-type impurities and contributing to the electrical conduction in the channel region C is low at a side close to the drain region D than a side close to the source region S. In the channel region C, a region having a relatively high P-type concentration is indicated as a high-concentration channel region 108 and a region having a relatively low P-type concentration is indicated as a low-concentration channel region 107 in the figure.

The semiconductor device illustrated in FIG. 1 further includes a middle-concentration region 104 which is entirely surrounded by the drift region 105, and has an N-type impurity concentration higher than that of the drift region 105 but lower than that of the high-concentration region 103. The middle-concentration region 104 at least partially surrounds the high-concentration region 103.

As illustrated in FIG. 1, according to a structure in which the drift region 105 entirely surrounds the high-concentration region 103, and the drift region 105 extends toward the channel region C from the drain region except the nearby area to the surface of the semiconductor substrate, a current at the time of an operation flows in a manner bypassing the substrate surface like the BLDD structure. However, unlike the BLDD structure, the drift region 105 completely surrounds the high-concentration region 103, and thus a higher voltage withstandable characteristic than a typical BLDD structure can be accomplished.

Moreover, according to the structure in which the P-type concentration of the channel region C is set to be lower at the drain side than the source side, an electric field at a PN junction between the channel region C and the drift region 105 can be reduced, and thus the amount of hot-carriers produced can be reduced in comparison with a typical BLDD structure.

According to this embodiment, it becomes possible to form an N-type drift region with a relatively high concentration, and thus the Kirk effect when an ESD occurs can be suppressed.

Furthermore, according to the structure in which the middle-concentration region 104 at least partially surrounds the high-concentration region 103, the Kirk effect can be further effectively suppressed. In particular, according to the structure illustrated in FIG. 1, the middle-concentration region 104 covers only areas of the high-concentration region 103 near the surface of the semiconductor substrate 1. Such a structure employs a triple structure of the drift region/middle-concentration region/high-concentration region near the surface of the semiconductor substrate where the Kirk effect is most likely to occur. However, the middle-concentration region 104 may be formed so as to cover the entire high-concentration region 103, and the Kirk effect can be further suppressed in such a case.

The N-type impurity concentrations of the drain region D explained above are as follows:

Drift region: Substantially $1 \times 10^{17}$ to $5 \times 10^{17}$ $cm^{-3}$

Middle-concentration region: Substantially $3 \times 10^{17}$ to $1 \times 10^{18}$ $cm^{-3}$ High-concentration region: Substantially $1 \times 10^{20}$ to $1 \times 10^{21}$ $cm^{-3}$ Moreover, according to this embodiment, the P-type polarity concentration that is a relatively high concentration injected in the channel region is reduced by counter doping of the N-type impurities, and thus the low-concentration channel region 107 can be formed. The counter doping can be carried out through an ion implantation process for forming the drift region 105. Hence, according to this embodiment, an additional process step of forming the low-concentration channel region 107 is unnecessary. The formation process of the low-concentration channel region 107 will be discussed in detail later.

Figure 2:
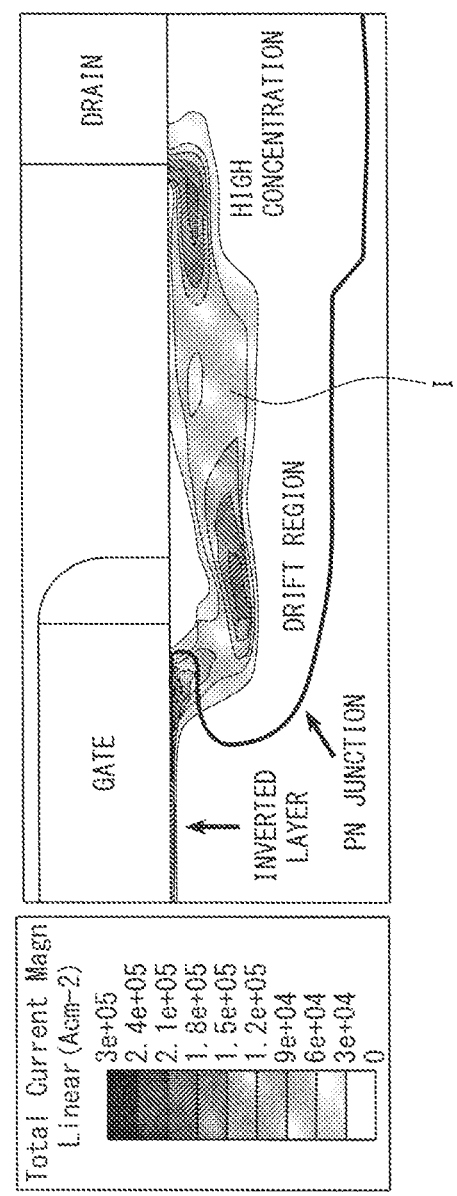
FIG. 2 is a diagram illustrating an obtained simulation result of a current path when a high-voltage MOS transistor illustrated in FIG. 1 is operated.

FIG. 2 is a diagram illustrating an obtained simulation result of a current path when the high-voltage MOS transistor illustrated in FIG. 1 operates. It becomes clear from FIG. 2 that a current I bypasses the semiconductor substrate surface right below the drain-side end of the gate electrode, and flows in the channel from the drain. That is, according to this embodiment, the above-explained structure realizes a high-voltage MOS transistor that satisfies both enhancement of the ESD withstandable characteristic and necessary hot-carrier lifetime.

A concentration distribution and a drain shape of the semiconductor device of this embodiment can be measured through analysis, such as SSRM (Scanning Spreading Resistance Microscopy), SCM (Scanning Capacitance Microscopy), or SIMS (Secondary Ion Mass Spectrometry).

[Semiconductor Device Manufacturing Method]

Figure 3A:
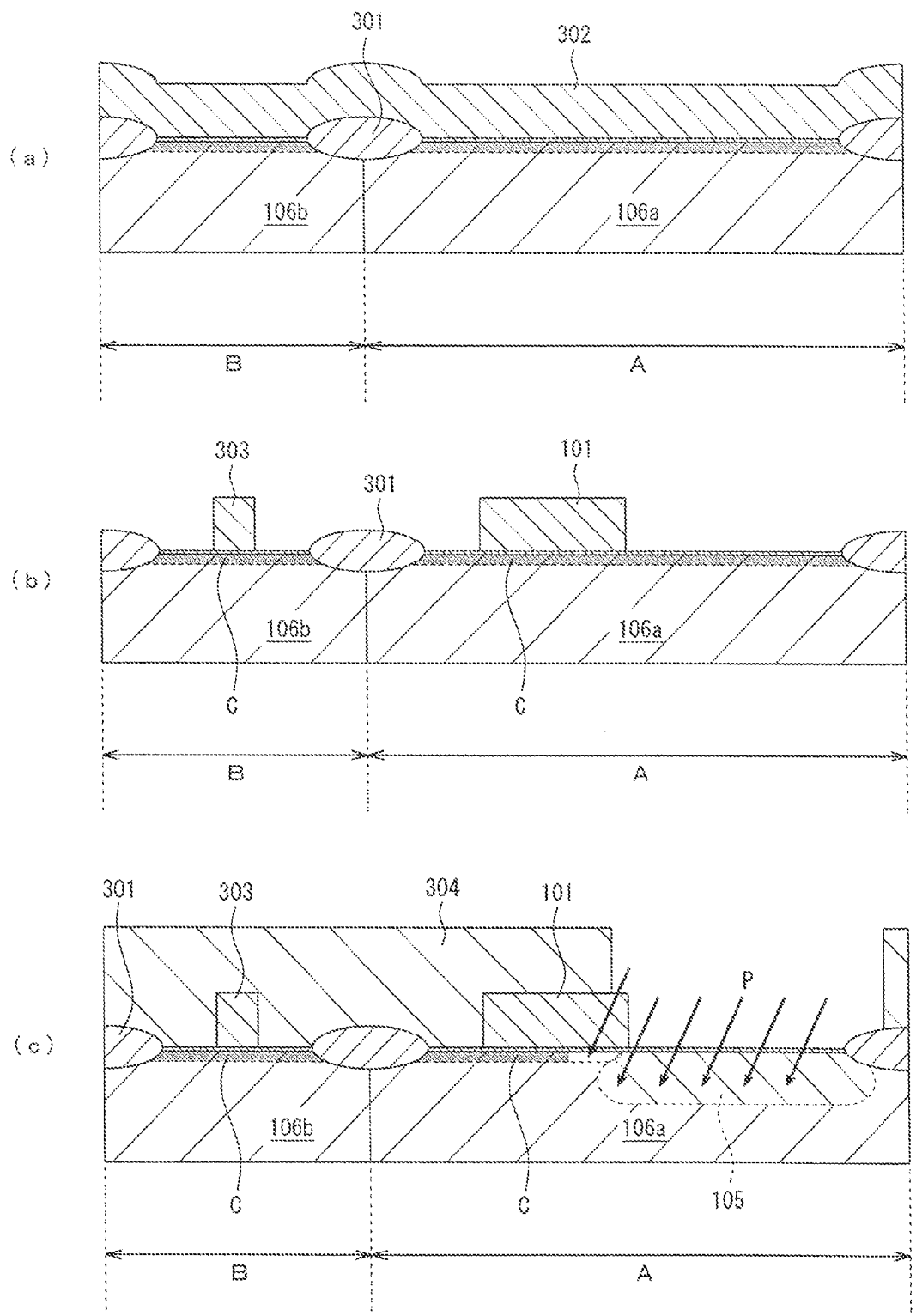
FIG. 3A is a diagram for explaining a method for manufacturing the high-voltage MOS transistor illustrated in FIG. 1.
Figure 3B:
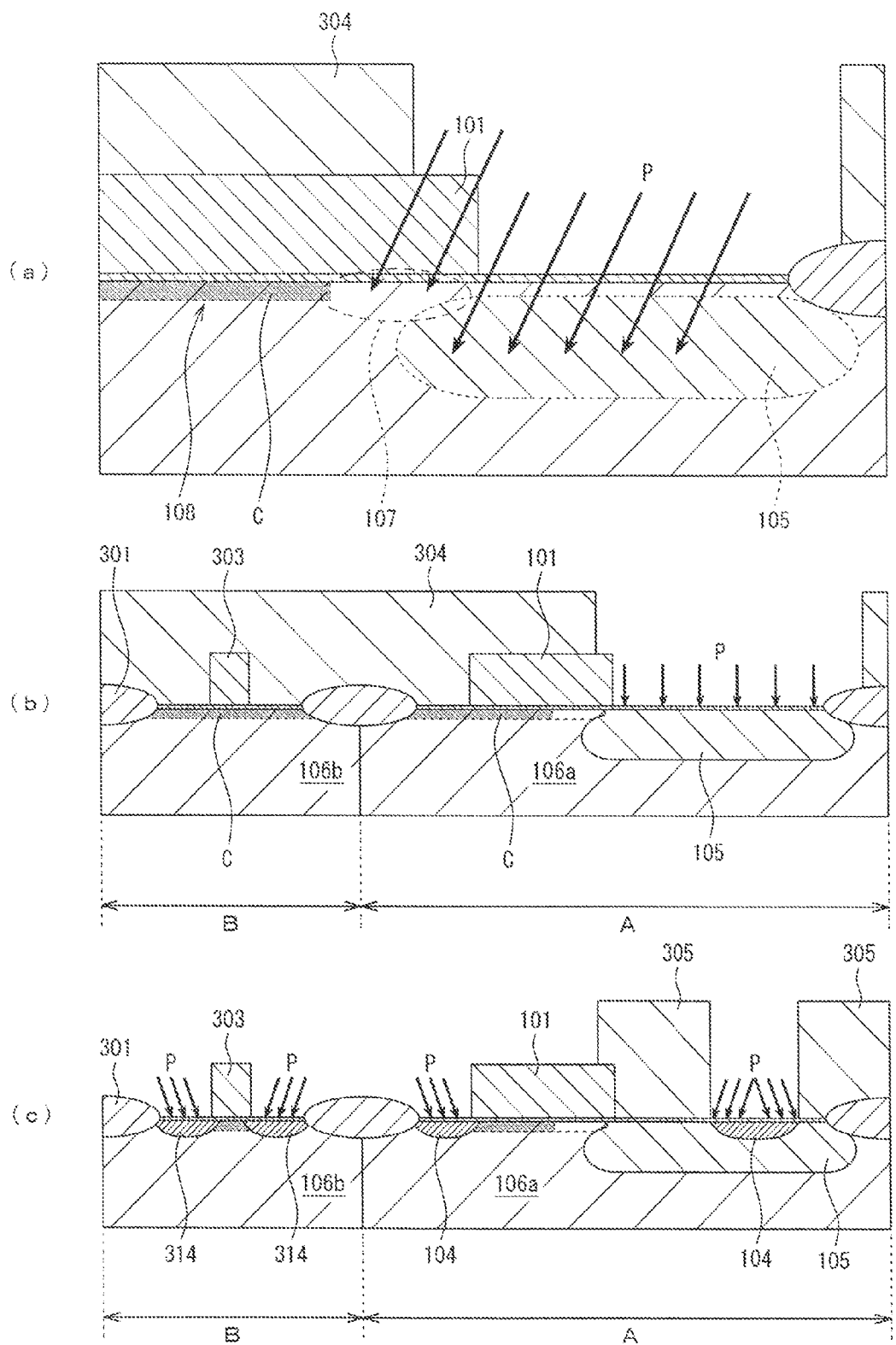
FIG. 3B is a diagram for explaining a manufacturing step of the high-voltage MOS transistor subsequent to a manufacturing step of the high-voltage MOS transistor illustrated in FIG. 3A.
Figure 3C:
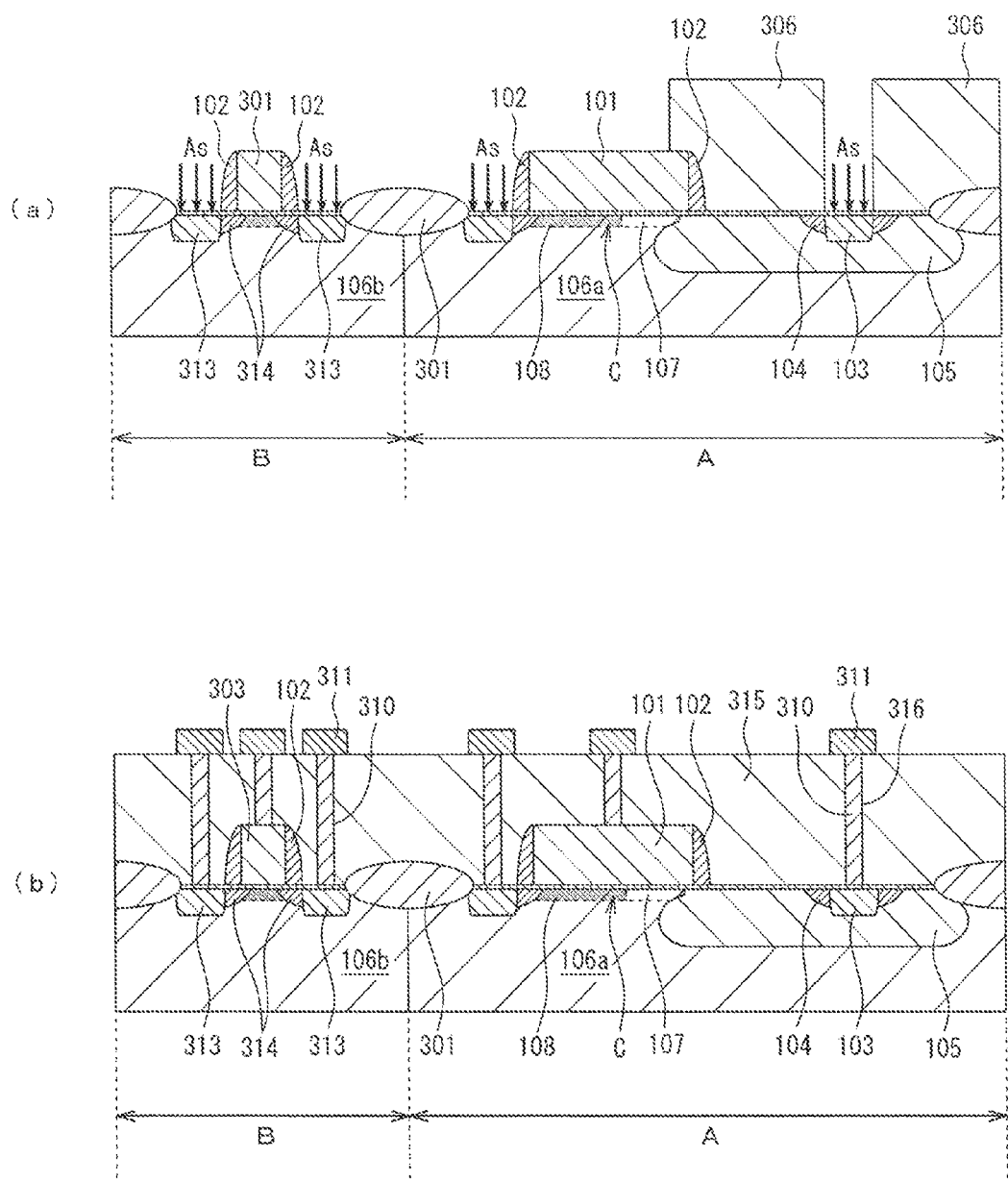
FIG. 3C is a diagram for explaining a manufacturing step of the high-voltage MOS transistor subsequent to a manufacturing step of the high-voltage MOS transistor illustrated in FIG. 3B.

Next, an explanation will be given of a method for manufacturing the semiconductor device of this embodiment. FIGS. 3A, 3B, and 3C are diagrams for explaining the method for manufacturing the high-voltage MOS transistor illustrated in FIG. 1. High-voltage MOS transistors often configure an integrated circuit together with a low-voltage MOS transistor. Hence, according to this embodiment, an explanation will be given of an example case in which the high-voltage MOS transistor of this embodiment and a low-voltage MOS transistor are manufactured on a substrate to explain how to manufacture the high-voltage MOS transistor.

As illustrated in FIG. 3A(a), according to this embodiment, first, P-type ions like boron are implanted in the substrate to form P-wells 106a and 106b. The P-well 106a is a well layer for a high-voltage MOS transistor, while the P-well 106b is a well layer for a low-voltage MOS transistor, and the respective concentrations of those layers maybe the same concentration in accordance with the operation condition of a MOS transistor, or may be different from each other.

Before or after the formation of the P-wells 106a and 106b, a LOCOS (Local Oxidation of Silicon) 301 is formed in the surface of the substrate to carry out an element isolation, and a region A where a high-voltage MOS transistor is to be formed and a region B where a low-voltage MOS transistor is to be formed are formed. The channel region including the region A and the region B surfaces is a P-type region with a higher concentration than that of the P-well regions 106a and 106b. The impurity concentration of the channel region is set in accordance with appropriate thresholds to the high-voltage MOS transistor and the low-voltage MOS transistor.

An N-type poly-silicon layer 302 is formed on the whole surfaces of the region A and the region B. It is necessary to adjust the thickness of the N-type poly-silicon layer 302 in such a way that, when impurities (ions) are injected in the drift region later, some of the ions can pass through the N-type poly-silicon layer 302. According to this embodiment, an N-type poly-silicon layer having a film thickness of, for example, 350 nm is prepared. However, the thickness of the N-type poly-silicon layer 302 is set as needed in accordance with the ion implantation energy, and the impurity concentrations of the channel region C and the low-concentration channel region 107 illustrated in FIG. 1, and the like.

Note that gate insulating films are formed on the region A and the region B right before the N-type poly-silicon layer 302 is formed. The gate insulating films of this embodiment are thin oxide films of substantially 12 nm.

Next, according to this embodiment, a resist applied on the N-type poly-silicon layer 302 is exposed to form a resist pattern, and etching is performed on the resist pattern to form gate electrodes 101 and 303 illustrated in FIG. 3A(b).

Next, according to this embodiment, N-type impurities are injected in at least either one side of the gate electrode 101 to form a drift region having a relatively low impurity concentration. In this embodiment, the impurity concentration of the drift region will be referred to as a concentration CD. According to this embodiment, phosphorous (P) ions are utilized at the time of ion implantation for the drift region formation.

As illustrated in FIG. 3A(c), the ion implantation to form the drift region 105 is carried out with a part of the region B and a part of the region A being covered by a resist pattern

304. Hence, according to this embodiment, the drift region is formed only at a drain-side of the high-voltage MOS transistor.

At this time, according to this embodiment, by utilizing the relatively high P-type concentration of the channel region C (substrate surface), ion implantation is carried out in such a way that only deeper portions from the outermost surface (0.1 μm or so from the surface) of the substrate become the N-type while maintaining the P-type high-concentration of the outermost surface of the substrate. According to this ion implantation, the dosage of ion implantation, an acceleration energy, and an implantation angle are adjusted appropriately to satisfy a condition in which P-ions pass through the gate electrode 101 and reach the lower area of the gate electrode 101.

Such an ion implantation can be realized when P-ions are implanted under the following example conditions:

Energy: 300 keV
Ion dosage: $1.8 \times 10^{13}$ cm$^{-2}$
Implantation angle: 45 degrees Through such ion implantation conditions, in the ion implantation for forming the drift region, as illustrated in FIG. 3B(a), the P-ions pass through the area not covered by the resist on the top face of the gate electrode 101, and reach the channel region C below the gate electrode 101. According to this embodiment, through such a process, only the area near the drain (0.5 μm or so toward the channel region from the end of the drain region) in the relatively high P-type concentration channel region can have the concentration of the holes emitted from the P-type ions and contributing to an electrical conduction to be a low concentration substantially same as the P-type concentration of the P-well 106a by the counter doping of the N-type ions. The low-concentration region will be the low-concentration channel region 107 illustrated in FIG. 1. When the injection amount of the counter doping is increased and the area that will be the low-concentration channel region becomes the N-type, if the N-type concentration is relatively low, the same advantage when such an area is the P-type is obtainable.

Next, according to this embodiment, as illustrated in FIG. 3B(b), in order to make the surface of the area to be the drift region 105 to be the N-type and to increase the concentration of the drift region, P-ions are shallowly implanted subsequent to the ion implantation illustrated in FIG. 3A(c) and 3B(a). The concentration of the drift region is adjustable through the above-explained two ion implantations with the shape being maintained. That is, when it is desired to increase the concentration of the drift region in order to enhance the ESD withstandable characteristic, the dosage of the P-ions in the second time can be increased.

The ion implantation illustrated in FIG. 3-2B can be realized under the following example conditions:

Energy: 70 keV
Ion dosage: $5.0 \times 10^{12}$ cm$^{-2}$
Angle: 7 degrees

According to the above-explained embodiment, as illustrated in FIG. 1, the drift region 105 can be formed so as to extend from the drain region D toward the channel region C except the nearby area to the surface of the semiconductor substrate.

Next, according to this embodiment, as illustrated in FIG. 3B(c), P-ions that are N-type impurities are implanted at both sides of the gate electrode 101 and the gate electrode 303 to form the middle-concentration regions 104 that has a higher impurity concentration (hereinafter, referred to as a concentration CM) than the concentration CD of the drift region 105.

According to this embodiment, prior to ion implantation to form the low-concentration source and drain of the low-voltage MOS transistor, a resist pattern 305 is formed on the region A illustrated in FIG. 3B(c). Next, P-ion implantation for forming the low-concentration source and drain of the low-voltage MOS transistor is performed over the resist pattern 305, thereby forming the middle-concentration region 104 entirely surrounded by the drift region 105.

At this time, in the region B, a low-concentration source or drain (hereinafter, referred to as a source/drain) 314 is formed among the sources and drains of the LDD structure with two-stage impurity concentrations. That is, the ion implantation illustrated in FIG. 3B(c) simultaneously enables ion implantation for forming the source/drain 314 of the low-voltage MOS transistor and ion implantation for forming the middle-concentration region 104 of the high-voltage MOS transistor illustrated in FIG. 1.

The ion implantation for forming the middle-concentration region 104 is carried out under the following example conditions:

Energy: 100 keV
Ion dosage: $2.0 \times 10^{13}$ cm$^{-2}$
Angle: 45 degrees

Next, according to this embodiment, as illustrated in FIG. 3C(a), N-type impurities As are implanted in the middle-concentration region 104 to form the high-concentration region 103 having a higher impurity concentration CH than the impurity concentration of the middle-concentration CM region. That is, according to this embodiment, the spacers 102 of insulating films surrounding the peripheries of the gate electrodes 101 and 303 are formed. Next, after a resist pattern 306 is formed on the region A, higher-density As ions than that of the formation of the middle-concentration region are implanted in the region A and the region B. According to this ion implantation, the high-concentration region 103 having a higher impurity concentration CH than the concentration of the middle-concentration CM region 104 can be formed.

Moreover, in the region B, a source/drain 313 of the low-voltage MOS transistor having a higher impurity concentration than that of the source/drain 314 is formed. That is, the ion implantation illustrated in FIG. 3C(a) simultaneously enables ion implantation for forming the source/drain 313 of the low-voltage MOS transistor and ion implantation for forming the high-concentration region 103 of the high-voltage MOS transistor illustrated in FIG. 1.

The ion implantation for forming the high-concentration region 103 can be carried out under the following example conditions:

Energy: 60 keV
Ion dosage: $3.0 \times 10^{15}$ cm$^{-2}$
Angle: 7 degrees

Next, according to this embodiment, a heat process is carried out to activate the injected impurities. After the heat process, as illustrated in FIG. 3C(b), an interlayer insulating film 315, contact holes 316, and metal wirings 310 and 311 are formed, and thus the low-voltage MOS transistor and the high-voltage MOS transistor are electrically connected with other elements. Through the above-explained processes, the high-voltage MOS transistor that is the semiconductor device of this embodiment is manufactured.

Figure 4:
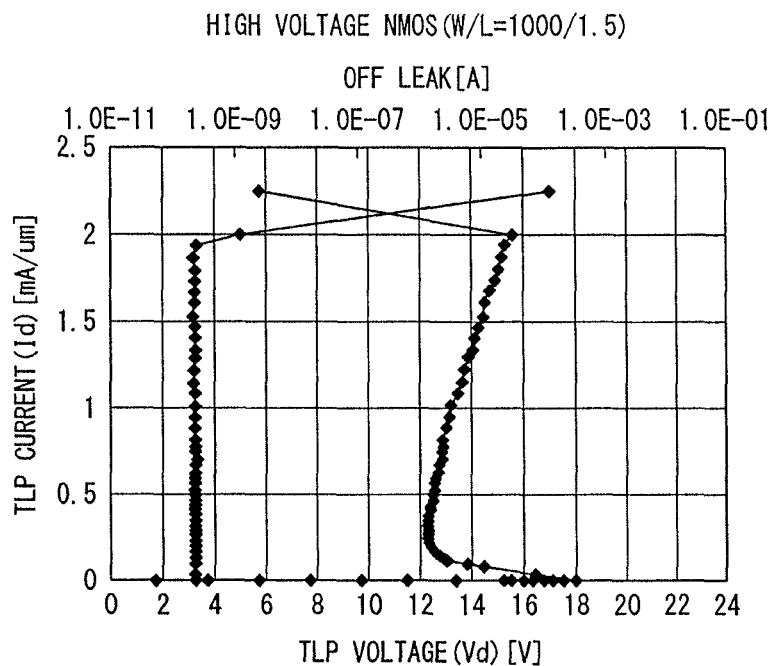
FIG. 4 is a TLP evaluation result of the high-voltage MOS transistor according to an embodiment of the present invention.
Figure 5:
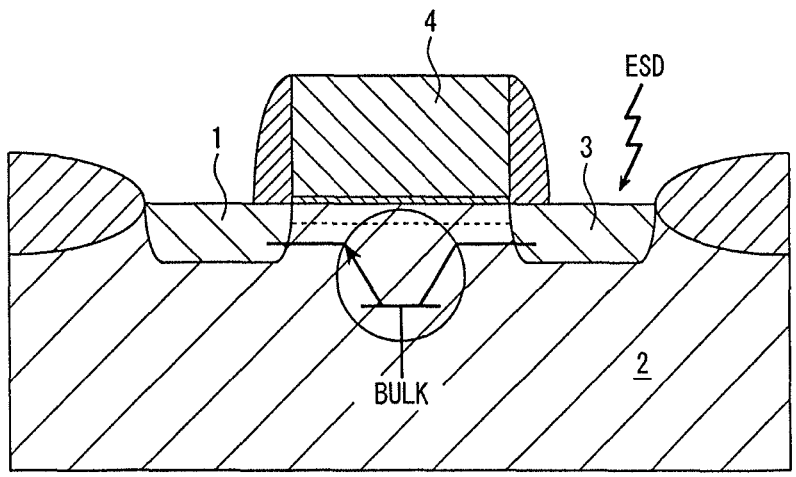
FIG. 5 is a diagram exemplifying an ESD protection element in a conventional semiconductor integrated circuit.
Figure 6:
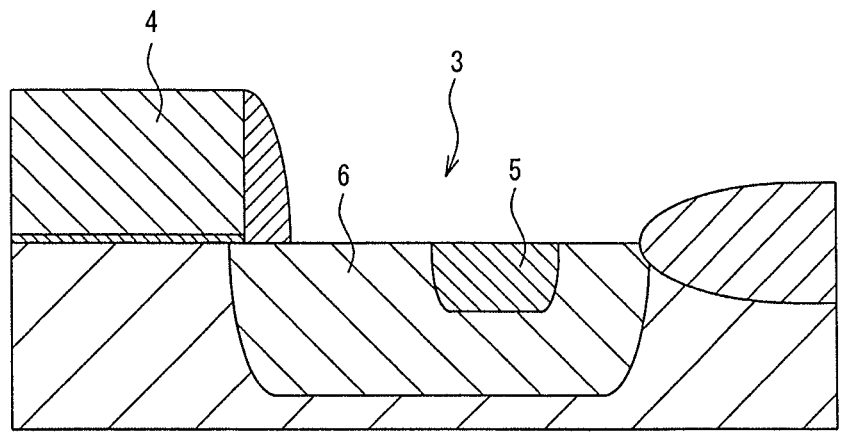
FIG. 6 is a diagram illustrating a relationship between a drift region in the high-voltage MOS transistor and a drain region therein.
Figure 7:
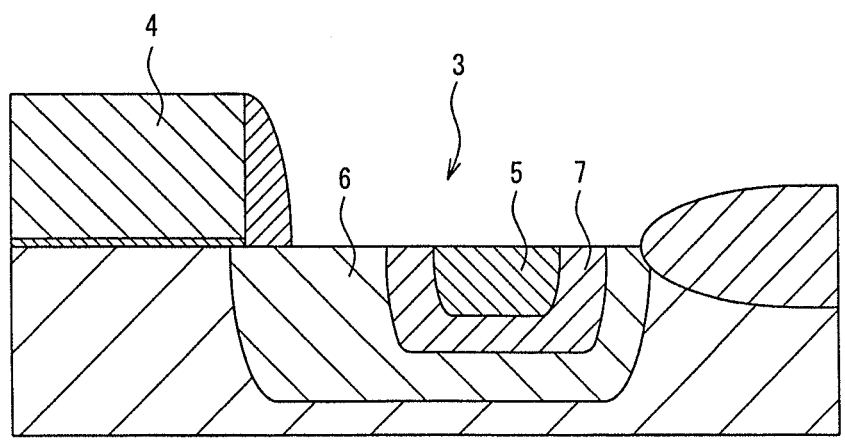
FIG. 7 is a diagram illustrating an example case in which the concentration gradient in the drain region is made gradual.
Figure 8:
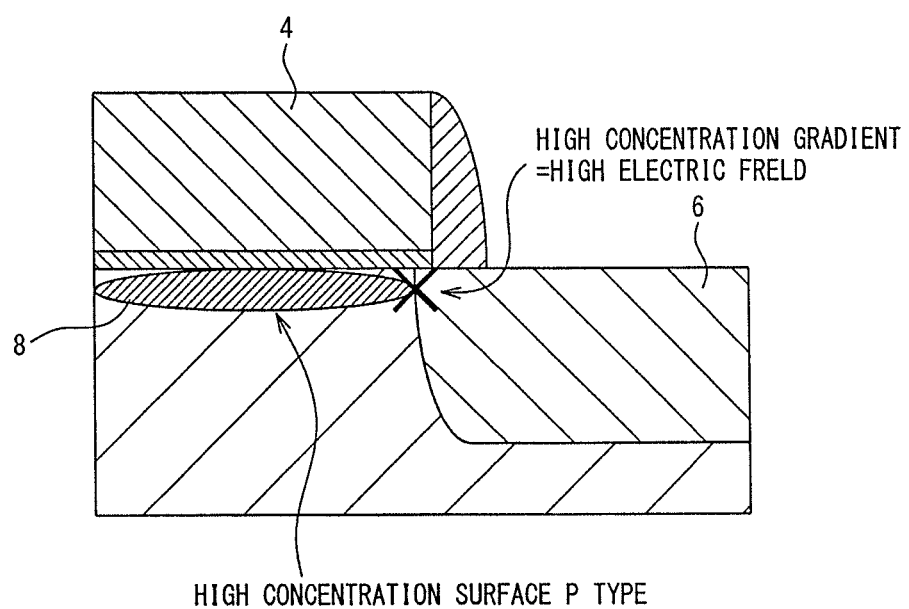
FIG. 8 is a diagram for explaining a fact that in the MOS transistor illustrated in FIG. 5 the impurity concentration gradient is remarkably large in a boundary where a channel region and a drain region adjoin with each other.

FIG. 4 is an evaluation result through a TLP (Transmission Line Pulse) of the high-voltage MOS transistor of this embodiment indicating that the high-voltage MOS transistor ensuring the sufficient hot-carrier lifetime has a high ESD withstandable characteristic. The vertical axis of FIG. 4 indicates a TLP current, while a horizontal axis indicates a TLP voltage. The high-voltage MOS transistor has a gate insulating film with a thickness of 12 nm and has a drain breakdown voltage of 18 V.

The present embodiment is not limited to the above-explained structure. For example, in the above-explained embodiment 1, the explanation was given of the example case in which the high-voltage MOS transistor and the low-voltage MOS transistor with the LDD structure are manufactured on the same substrate, but it is possible to form the high-voltage MOS transistor of this embodiment and other elements, such as a PMOS transistor, a bipolar transistor, a resistor element, and a capacitor, on the same substrate.

Moreover, a silicide layer may be formed in the contact portions of the high-voltage MOS transistor illustrated in FIG. 3C(b).

The scope and spirit of the present invention are not limited to the illustrated, described, and exemplified embodiment, and include all embodiments that bring about the equivalent advantages to the intended advantages of the present invention. Moreover, the scope and spirit of the present invention are not limited to the combination of the subject matters set forth in appended claims, but can be defined by all desired combinations of particular subject matters among all disclosed subject matters.

Industrial Applicability

The present invention is applicable to any MOS transistors needing a high voltage withstandable characteristic as long as a suppression of an ESD hot-carrier deterioration and a protection against an ESD are required.

REFERENCE SIGNS LIST 101, 303 Gate electrode
102 Spacer
103 High-concentration region
104 Middle-concentration region
105 Drift region
106, 106a, 106b P-well
107 Low-concentration channel region
108 High-concentration channel region
302 N-type poly-silicon layer
304, 305, 306 Resist pattern
310, 311 Metal wiring
313, 314 Source/drain
315 Interlayer insulating film
316 Contact hole

The invention claimed is:

1. A semiconductor device comprising a MOS transistor, the MOS transistor comprising:
a source region and a drain region both formed in a semiconductor substrate; and
a channel region formed between the source region and the drain region, wherein
a concentration of a charged particle which is emitted from a first impurity with a first polarity injected in the channel region and which contributes to an electrical conduction in the channel region is lower at a side close to the drain region than at a side close to the source region,
the drain region includes a drift region into which a second impurity with a second polarity is injected, and
the drift region extends toward the channel region from the drain region to form an extending portion that is immediately below the channel region.

2. A semiconductor device, comprising:
a source region and a drain region both formed in a semiconductor substrate; and
a channel region formed between the source region and the drain region, wherein a concentration of a charged particle which is emitted from a first impurity with a first polarity injected in the channel region and which contributes to an electrical conduction in the channel region is lower at a side close to the drain region than at a side close to the source region, the drain region includes a drift region into which a second impurity with a second polarity is injected, and the drift region extends toward the channel region from the drain region except a nearby area to a surface of the semiconductor substrate,
another MOS transistor having a lower drain breakdown voltage than the MOS transistor;
a high-concentration region entirely surrounded by the drift region and having a higher concentration of the second polarity than the concentration at the drift region; and
a middle-concentration region having an impurity concentration of the second polarity higher than an impurity concentration of the second polarity at the drift region and lower than an impurity concentration of the second polarity at the high-concentration region,
wherein the middle-concentration region at least partially surrounds the high-concentration region.

3. The semiconductor device according to claim 2, wherein the middle-concentration region is formed simultaneously with a middle-concentration region of a source/drain region of the another MOS transistor, and
the high-concentration region is formed simultaneously with a high-concentration region of another source/drain region of the another MOS transistor.

4. A method for manufacturing a semiconductor device comprising a MOS transistor that includes a source region and a drain region both in a semiconductor substrate, the method comprising steps of:
injecting a first impurity with a first polarity into the semiconductor substrate to form a first impurity diffusion region with the first polarity in a surface of the semiconductor substrate;
forming a gate electrode on the first impurity diffusion region;
injecting a second impurity with a second polarity through the drain region and a part of a top face of the gate electrode adjoining to the drain region;
forming a second impurity diffusion region having a lower concentration of a charged particle emitted from the first impurity and contributing to an electrical conduction than the first impurity diffusion region below the gate electrode and at an end thereof at the drain-region side; and
forming a drift region with the second polarity that extends toward a channel region from the drain region to form an extending portion that is immediately below the second impurity diffusion region.

5. A method for manufacturing a semiconductor device comprising a MOS transistor that includes a source region and a drain region both in a semiconductor substrate, the method comprising steps of:
injecting a first impurity with a first polarity into the semiconductor substrate to form a first impurity diffusion region with the first polarity in a surface of the semiconductor substrate;
forming a gate electrode on the first impurity diffusion region;
injecting a second impurity with a second polarity through the drain region and a part of a top face of the gate electrode adjoining to the drain region;
forming a second impurity diffusion region having a lower concentration of a charged particle emitted from the first impurity and contributing to an electrical conduction than the first impurity diffusion region below the gate electrode and at an end thereof at the drain-region side;

forming, below the second impurity diffusion region, a drift region with the second polarity that extends toward a channel region;

injecting the second impurity into the drift region to form a middle-concentration region having a higher impurity concentration than an impurity concentration at the first impurity diffusion region; and injecting the second impurity into the middle-concentration region to form a high- concentration region having a higher impurity concentration than an impurity concentration at the middle-concentration region.

6. The semiconductor device manufacturing method according to claim 5, wherein in the formation of the middle-concentration region, a middle-concentration region of a source/drain region of another MOS transistor with a lower drain breakdown voltage than a drain breakdown voltage of the MOS transistor is simultaneously formed, and in the formation of the high-concentration region, a high-concentration region of another source/drain region of the another MOS transistor are simultaneously formed.

7. The semiconductor device manufacturing method according to claim 4, wherein in the step of injecting the second impurity, the second impurity with the second polarity is injected into the first impurity diffusion region through the drain region and the part of the top face of the gate electrode adjoining to the drain region.

8. The semiconductor device manufacturing method according to claim 4, wherein the step of injecting the second impurity comprises:

injecting the second impurity with the second polarity at a first injection energy through the drain region and the part of the top face of the gate electrode adjoining to the drain region, such that a deeper portion than the first impurity diffusion region has the second polarity with the first polarity of the first impurity diffusion region formed in the surface of the semiconductor substrate being maintained; and then injecting the second impurity with the second polarity into the first impurity diffusion region of the drain region at a second injection energy smaller than the first injection energy to change the first polarity of the first impurity diffusion region of the drain region to the second polarity.

* * * * *